United States Patent
Duerr et al.

(10) Patent No.: US 11,459,229 B2
(45) Date of Patent: Oct. 4, 2022

(54) MMS, MMS ARRAY, MEMS ACTUATOR AND METHOD FOR PROVIDING AN MMS

(71) Applicant: Fraunhofer-Gesellschaft zur Foerderung der angewandten Forschung e.V., Munich (DE)

(72) Inventors: Peter Duerr, Dresden (DE); Detlef Kunze, Dresden (DE); Andreas Gehner, Dresden (DE); Martin Friedrichs, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 578 days.

(21) Appl. No.: 16/523,718

(22) Filed: Jul. 26, 2019

(65) Prior Publication Data
US 2019/0345023 A1   Nov. 14, 2019

Related U.S. Application Data

(63) Continuation of application No. PCT/EP2018/051818, filed on Jan. 25, 2018.

(30) Foreign Application Priority Data

Jan. 27, 2017   (DE) .................... 10 2017 011 821.3
Jan. 27, 2017   (DE) .................... 10 2017 201 309.5

(51) Int. Cl.
G02B 26/08    (2006.01)
B81B 3/00     (2006.01)

(52) U.S. Cl.
CPC ........ B81B 3/0072 (2013.01); G02B 26/0833 (2013.01); B81B 2201/042 (2013.01);
(Continued)

(58) Field of Classification Search
CPC ............ B81B 3/0072; B81B 2201/042; B81B 2203/0154; B81B 2203/0163;
(Continued)

(56) References Cited

U.S. PATENT DOCUMENTS 7,944,124 B1    5/2011   Bernstein
2002/0146200 A1  10/2002  Kudrle et al.
(Continued)

FOREIGN PATENT DOCUMENTS

DE   10108198 A1   9/2002
EP    2233961 B1   2/2016
(Continued)

OTHER PUBLICATIONS

Landau L.D., et al., "Theory of elasticity", Pergamon Press, London, 1959.
(Continued)

*Primary Examiner* — Euncha P Cherry
(74) *Attorney, Agent, or Firm* — Perkins Coie LLP; Michael A. Glenn

(57) ABSTRACT

An MMS includes a substrate, an element movable with respect to the substrate and a frame structure. A first pair of springs is arranged between the substrate and the frame structure along a first spring direction. A second pair of springs is arranged between the movable element and the frame structure along a second spring direction. The frame structure is configured to generate tensile stress in the second pair of springs at tensile stress acting in the first pair of springs.

25 Claims, 15 Drawing Sheets

(52) U.S. Cl.
CPC ............. *B81B 2203/0154* (2013.01); *B81B 2203/0163* (2013.01); *B81B 2203/058* (2013.01)

(58) Field of Classification Search
CPC ...... B81B 2203/058; B81B 2201/0242; G02B 26/0833
See application file for complete search history.

(56) References Cited

U.S. PATENT DOCUMENTS

| | | | |
|---|---|---|---|
| 2003/0183007 | A1 | 10/2003 | Willig et al. |
| 2003/0197446 | A1 | 10/2003 | Ives |
| 2006/0032308 | A1 | 2/2006 | Acar et al. |
| 2012/0081598 | A1 | 4/2012 | Calvet et al. |
| 2012/0099176 | A1* | 4/2012 | Zhou ............... G02B 26/0841 359/290 |
| 2012/0216612 | A1 | 8/2012 | Seeger et al. |
| 2014/0028152 | A1 | 1/2014 | Lai et al. |
| 2016/0013763 | A1 | 1/2016 | Tomimatsu et al. |

FOREIGN PATENT DOCUMENTS

| | | |
|---|---|---|
| JP | 2007065649 A | 3/2007 |
| JP | 2007522528 A | 8/2007 |
| JP | 2008091854 A | 4/2008 |
| JP | 2008194813 A | 8/2008 |
| JP | 2014142517 A | 8/2014 |
| JP | 2016517355 A | 6/2016 |
| JP | 2016147360 A | 8/2016 |
| JP | 2018016708 A | 2/2018 |
| WO | 2005078506 A2 | 8/2005 |
| WO | 2014141114 A1 | 9/2014 |

OTHER PUBLICATIONS

"Buckling", Wikipedia, https://en.wikipedia.org/wiki/Buckling.
Yu-Sheng Yang, et al., "A large-displacement thermal actuator designed for MEMS pitch-tunable grating", Journal of Micromechanics and Microengineering 19.1, 2008, p. 1-12.

* cited by examiner

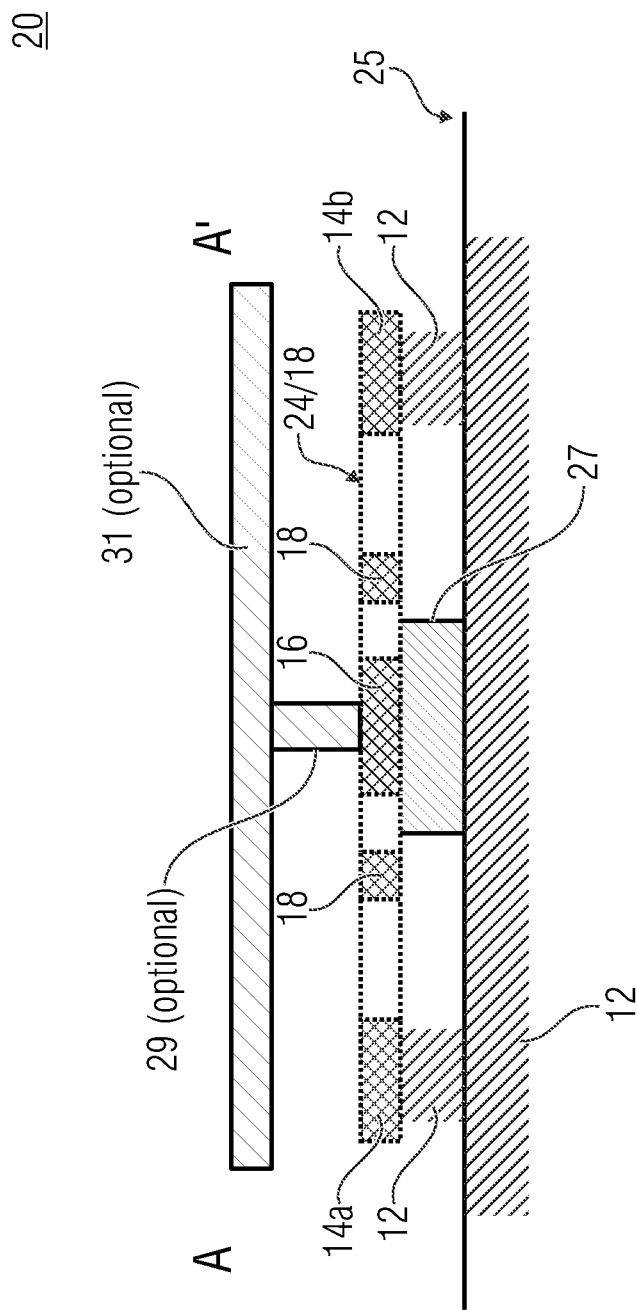

MMS, MMS ARRAY, MEMS ACTUATOR AND METHOD FOR PROVIDING AN MMS

CROSS-REFERENCE TO RELATED APPLICATIONS

This application is a continuation of copending International Application No. PCT/EP2018/051818, filed Jan. 25, 2018, which is incorporated herein by reference in its entirety, and additionally claims priority from German Applications Nos. 10 2017 201 309.5, filed Jan. 27, 1017 and 10 2017 011 821.3, filed Jan. 27, 1017, which are all incorporated herein by reference in their entirety.

The present invention relates to an MEMS comprising an element that is movable with respect to a substrate with a frame structure, to an MEMS array, to an MEMS actuator and to a method for providing an MEMS. Further, the present invention also relates to a micromechanical element with stress compensation.

BACKGROUND OF THE INVENTION

An MEMS actuator can be used, for example, to move a micromirror connected therewith and to position the same as desired. Such actuators are increasingly used for a wide range of applications, such as spatial light modulators, scanner mirrors, optical switches for coupling optical fibers (optical cross-connect), microvalves, electric microswitches and others.

Usually, the position of a movable actuator part is controlled by an applied electric signal. In many cases, electrostatic force of attraction is used as physical effect, but electromagnetic forces and piezoelectric or thermal expansion can also be used. Such actuators frequently have a resetting elastic suspension providing a respective counterforce for static equilibrium deflection.

Based on the type of executable movement, a differentiation is made between rotating/tilting actuators and translatory actuators as well as actuator types enabling both types of motion. Rotating/tilting actuators can have a gimbal suspension. In micromechanics, such gimbal suspensions work quite well, as long as the springs are not under excessive mechanical tension. However, in micromechanics, mechanical tensions can easily arise, either due to production processes or during operation due to temperature variations and the different thermal coefficients of expansion of the materials used for springs, rigid actuator parts, the substrate and possibly the housing. Tension in the springs changes the spring constant and hence the deflection behavior of the actuator. Compressive stress, which can result in buckling of the springs (depending on the geometry) when exceeding a critical value, is particularly unfavorable [1, 2]. Such buckling frequently makes the actuators completely unusable although applications are possible where this effect is used advantageously. Thus, generally, an attempt is made to produce the springs with low tensile stress. Depending on the production technology, however, adjusting the desired stress value is frequently not sufficiently precise.

In micromechanic gimbal suspensions, only in some cases, surprisingly, buckling springs can be seen although the system as a whole is under slight tensile stress. In the case when, for example, the outer springs are anchored at the substrate, the gimbal frame can deform under the tensile stress of the outer springs due to its (although low) elasticity, such that the inner springs are under compressive stress and can buckle, even when they still had a slight tensile stress in the original form of the gimbal frame. Such a behavior is shown in FIGS. 12a and 12b. FIGS. 12a and 12b show the system in the original state, illustrated as full surface and the system when tensile forces are applied to outer elements 1004a and 1004b illustrated in dotted lines. For the occurrence of the tensile force, the reference numbers are provided with an apostrophe. This means the outer element 1004a' corresponds to the outer element 1004a when the tensile force occurs. An element 1003 is connected to outer elements 1004a and 1004b via a gimbal frame 1002 configured in a round manner. Both the outer elements 1004a and 1004b can be connected to a substrate while the element 1003 is an element to be moved or is connected, for example, to an element to be moved or positioned, such as a micromirror. It is also possible that the element 1003 is connected to the substrate and the outer elements 1004a and 1004b are connected to the element to be positioned or are this element. A pair of springs including springs 1005a and 1005b is arranged between the outer elements 1004a and 1004b and the gimbal frame 1002. A further pair of springs including springs 1006a and 1006b is arranged between the element 1003 and the gimbal frame 1002. Based on tensile force 1007, the gimbal frame 1002 can deform, such that compressive stress onto the springs 1006a and 1006b results which can cause buckling of the springs.

FIG. 12b shows a similar scenario where the gimbal frame 1002 and the (inner) element 1003 are configured in a square manner. Here, the compressive stress on the springs 1006a and 1006b can also cause buckling of the springs. In other cases, the outer springs can also receive compressive stress when the gimbal frame deforms under the tension of the inner springs. This means, in response to tensile forces from the substrate, a circular or square gimbal frame deforms. The inner springs receive strong compressive stress and buckle, here, for example, by shifting or rotating the actuator plate in the center.

Buckling of the springs can take place in different modes. Four examples are shown in FIGS. 12a and 12b, but further examples exist, in particular into the third dimension or in connection with torsion of the springs. This effect does usually not occur in conventional precision gimbal suspensions since normally no springs are used, but axes whose bearings also allow slight axial movement.

In conventional micromechanical gimbal suspensions, the gimbal frames are mostly built in a very strong manner in order to minimize the above-described deformation. However, this has the effect that the springs come under more stress with respect to the substrate. These stresses can be reduced in that the spring does not rigidly connect to the gimbal frame or substrate, but with a further spring that runs transversally to the first spring and is connected to the substrate. This is illustrated in FIG. 13. The spring 1005a is connected to a spring 1008a that is connected to the outer element 1004a. Also, the spring 1005b is connected to a spring 1008b that again establishes a connection to the outer element 1004b. The frame 1002 can be configured in a particularly rigid manner. The transverse springs 1008a and 1008b at the outer springs 1005a and 1005b, respectively, reduce the stress introduced by the substrate. The low residual deformation of the gimbal frame 1002 results in only little compressive stress in the inner springs 1006a and 1006b, such that buckling can partly be prevented. Thus, this can function sufficiently well but normally a residual deformation remains and hence pressure onto the inner springs 1006a and 1006b. Additionally, the rigid gimbal frame needs a lot of space and is correspondingly heavy.

Additionally, this procedure is only of limited assistance when, for example, during production, the gimbal frame itself is under higher tensile stress than the movable micromechanical structures inside the same and then (partly) relaxes when releasing the system. In this case, compressive stress in the inner springs could, at most, be reduced again by further transverse springs which, however, only results in partial reduction. Similar problems can also result when the inner springs 1006a and 1006b are connected to the substrate and the outer springs 1005a and 1005b to the movable actuator part.

Therefore, concepts that reduce or prevent occurrence of compressive stress in MEMS springs would be desirable.

SUMMARY

According to an embodiment, an MMS may have: a substrate; an element moveable with respect to the substrate; a frame structure; a first pair of springs arranged between the substrate and the frame structure along a first spring direction; and a second pair of springs arranged between the movable element and the frame structure along a second spring direction; wherein the frame structure is configured to generate tensile stress in the second pair of springs at tensile stress acting in the first pair of springs; wherein a first and a second side of the frame structure where one spring each of one of the two pairs of springs is arranged comprise a first partial area and a second partial area between which the respective spring is arranged, wherein the first and the second partial area are arranged at an angle of less than 180° measured outside with respect to the frame structure.

According to another embodiment, an MMS may have: a substrate; an element movable with respect to the substrate; a frame structure; a first and a second spring arranged between the substrate and the frame structure along a first spring direction; and a third and fourth spring arranged between the movable element and the frame structure along a second spring direction; wherein the first spring at an end of the frame facing away from the frame structure is connected to a first anchor area of the substrate via a first lever element and to a second anchor area of the substrate via a second lever element, and wherein the second spring at an end facing away from the frame structure is connected to third anchor area of the substrate via a third lever element and to a fourth anchor area of the substrate via a fourth lever element; wherein the first, second, third and fourth anchor area can be displaced with respect to one another along a first, second, third and fourth displacement direction when the substrate expands; and wherein each of the lever elements is arranged at an angle of at least 70° and at most 100° at the respective anchor area relative to the displacement direction.

According to another embodiment, an inventive MMS may have a micromirror connected to the movable element.

Another embodiment may have an MMS array including a plurality of inventive MMS.

Another embodiment may have an MMS actuator including an inventive MMS and/or an MMS array including a plurality of inventive MMS.

A core idea of a first aspect is the finding that a gimbal structure can be implemented such that tensile stress acting in a first pair of springs of a gimbal suspension generates tensile stress in a second pair of springs of the gimbal suspension. This enables prevention of occurrence of compressive stress due to the tensile stress and this is enabled by the configuration of the frame structure.

The core idea of a second aspect is the finding that by preventing tensile forces in the first spring elements, deformation of the movable structure and hence compressive forces in the second spring elements can be reduced or prevented and that this can be obtained by a lever structure between springs and anchor areas at the substrate, wherein the levers are essentially at a right angle to the expected displacement directions of the anchor areas.

According to an embodiment of the first aspect, a micromechanical system (MMS) comprises a substrate and an element movable with respect to the substrate. Further, the MMS includes a frame structure and a first pair of springs arranged between the substrate and the frame structure along a first spring direction. A second pair of springs is arranged between the movable element and the frame structure along a second spring direction. The frame structure is configured to generate tensile stress in a second pair of springs at tensile stress acting in a first pair of springs. This allows the conversion of occurring tensile forces as they can occur, for example, by releasing the MMS in particular by expansion of the surrounding substrate, into tensile stress acting in the springs between the movable element and the frame structure. This allows low or no compressive stress and hence higher reliability of the spring elements and hence the MMS since buckling or breaking of the springs due to compressive forces is reduced or prevented.

According to one embodiment, a distance of two distal ends of two opposing sides of the frame structures can be extended based on the tensile stress acting in the first pair of springs in order to generate the tensile force on the second pair of springs. This means the tensile force on the first pair of springs is converted into extension of the frame structure along a direction transverse to this first pair of springs, wherein the extension can be used for obtaining the tensile force onto the second pair of springs.

According to a further embodiment, a first and second side of the frame structure where one spring each of the first pair of springs is arranged comprise a first partial area and a second partial area between which the respective spring is arranged. The first and second partial areas are arranged at an angle of less than 180° measured outside with respect to the frame structure, i.e., such that the frame structure is configured in a concave manner. The value of this angle allows configuration of the extent of tensile force passed on to the second pair of springs and as a result a high degree of reliability of the MMS.

According to a further embodiment, which can be implemented combined with the above embodiment but also independent of the same, a third and fourth side of the frame structure, where one spring each of the second pair of springs is arranged, comprise a first partial area and a second partial area between which the respective spring is arranged. The first and the second partial areas are arranged at an angle of less than 180° measured outside with respect to the frame structure. This also allows the advantage of a configuration of the extent of tensile force that is transferred.

According to a further embodiment, the frame structure is configured such that the same comprises, adjacent to corners of the frame and/or adjacent to areas where the springs of the first or second pair of springs are arranged, a hinge, for example a flexure bearing. This allows specific interference with the frame structure under influence of the tensile force and hence a further increase of reliability.

According to a further embodiment, the MMS includes a compensation structure arranged between two sides of the frame structure and mechanically fixed to the same, wherein a bending stiffness of the frame structure along the first spring direction and a bending stiffness of the frame structure along the second spring direction have a comparatively higher value and a comparatively lower value, i.e., two sides of the frame structure have a lower value of bending stiffness compared to two other sides of the frame structure. The compensation structure extends along the spring direction along which the frame structure has the bending stiffness with the comparatively higher value between the two sides. This can also be considered such that the sides having a lower bending stiffness are enforced by the compensation structure such that undesired bending of the frame structure is reduced or prevented.

An MMS according to the second aspect includes a substrate, an element movable with respect to the substrate and a frame structure. The MMS includes a first and a second spring arranged between the substrate and the frame structure along a first spring direction and includes a third and a fourth spring arranged between the movable element and the frame structure along a second spring direction. The first spring at an end facing away from the frame structure is connected to a first anchor area of the substrate via a first lever element and connected to a second anchor area of the substrate via a second level element. The second spring at an end facing away from the frame structure is connected to a third anchor area of the substrate via a third level element and to a fourth anchor area of the substrate via a fourth level element. When the substrate is expanded, the first, second, third and fourth anchor areas are displaced with respect to one another along a first, second, third and fourth direction of movement. Each of the level elements is arranged at an angle of at least 75° and at most 105° at the respective anchor area relative to the first, second, third or fourth displacement direction. It is advantageous that when releasing the substrate but also during thermally induced expansion or compression of the substrate and hence the displacement of the anchor elements, inducing compressive forces onto the first and second spring is at least reduced, since by arranging the lever elements at the angle a change of the length of the first and second spring due to displacement of the anchor elements is low. This allows high reliability of the MMS.

A further embodiment provides an MMS array having a plurality of MMS that can be arranged on the same substrate.

A further embodiment provides an MMS actuator having an MMS according to the above described embodiments.

Further embodiments provide a method for providing an MMS according to the first aspect. The method includes providing a substrate, providing an element movable with respect to the substrate and providing a frame structure movable with respect to the substrate. Further, the method includes arranging a first pair of springs between the substrate and the frame structure along a first spring direction and arranging a second pair of springs between the movable element and the frame structure along a second spring direction. The frame structure is provided such that the same generates tensile stress in the second pair of springs at tensile stress acting in the first pair of springs.

Further embodiments provide a method for producing an MMS according to the second aspect. The method includes providing a substrate, providing an element movable with respect to the substrate, providing a frame structure movable with respect to the substrate and providing a first, second, third and fourth anchor area at the substrate, such that the first, second, third and fourth anchor area are displaced with respect to one another along a first, second, third and fourth direction when the substrate expands. The method includes arranging a first and a second spring between the substrate and the frame structure along a first spring direction. Further, the method includes arranging a third and fourth spring between the movable element and the frame structure along a second spring direction. Further, the method includes connecting an end of the first spring facing away from the frame structure to the first anchor area of the substrate via a first level element and to the second anchor area of the substrate via a second lever element. An end of the second spring facing away from the frame structure is connected to the third anchor area of the substrate via a third lever element and to the fourth anchor area of the substrate via a fourth lever element. Connecting is performed such that each of the lever elements is arranged at an angle of at least 75° and at most 105° at the respective anchor area relative to the displacement direction of the anchor area.

BRIEF DESCRIPTION OF THE DRAWINGS

Embodiments of the present invention will be detailed subsequently referring to the appended drawings, in which:

FIG. 2b is a schematic side sectional view of the MMS according to FIG. 2a in a sectional plane according to an embodiment;

FIG. 3 is a schematic top view of a configuration of a soft side of a frame structure as it can be used, for example, in the MMS according to FIG. 1 or FIG. 2a;

DETAILED DESCRIPTION OF THE INVENTION

Before embodiments of the present invention will be discussed in more detail based on the drawings, it should be noted that identical, functionally equal or equal elements, objects and/or structures are provided with the same reference numbers in the different figures, such that the description of these elements illustrated in different embodiments is inter-exchangeable or inter-applicable.

The following explanations relate to the configuration and/or production of micromechanical structures (MMS).

Embodiments allow reduction and possibly prevention of generation of compressive forces acting on spring elements of the described MMS. Deformations of the substrate or other structural parts causing tensile forces can occur, for example, during a release of the MMS. Alternatively or additionally, they can occur when internal or outer forces are generated and/or due to thermally induced deformation of the respective structural part. For example, heating the substrate can cause expansion of the substrate which is greater or smaller compared to an expansion of the spring elements or other elements of the MMS, such that forces are generated due to the differing thermal expansion. From this, it becomes immediately clear that the following explanations relate, without any limitations, also to microelectromechanical structures (MEMS) as they are used, for example, in actuators. The same can comprise actuators generating forces and/or temperatures for setting in motion at least parts of the structure, wherein this also generates forces.

MMS and/or MEMS can include a plurality of materials. For example, the same can be formed of a semiconductor material or can be molded, i.e. formed on such a semiconductor material such as silicon. Formation of different structures can be performed, for example, by depositing the same or differing materials, wherein here different methods can be used, such as chemical vapor deposition, physical vapor deposition and/or epitaxial growth. During the generation of such structures on a substrate or in a substrate, sacrificial layers can be used that are at least partly removed at a later time for allowing movement between individual parts. If different materials are deposited or used in the MMS, a voltage gradient can occur in the material which has the effect that a movement in one or several structural parts takes place when removing the sacrificial layers. For example, the movable (with respect to the substrate) structure can contract which is equivalent to the fact that the substrate expands with respect to the movable elements. Although most of the following explanations only relate to the fact that the substrate expands with respect to other parts of the MMS, tensile stress in spring elements between a frame structure connected to the substrate via spring elements can also be obtained in that the frame structure contracts with respect to the substrate.

Figure 1:
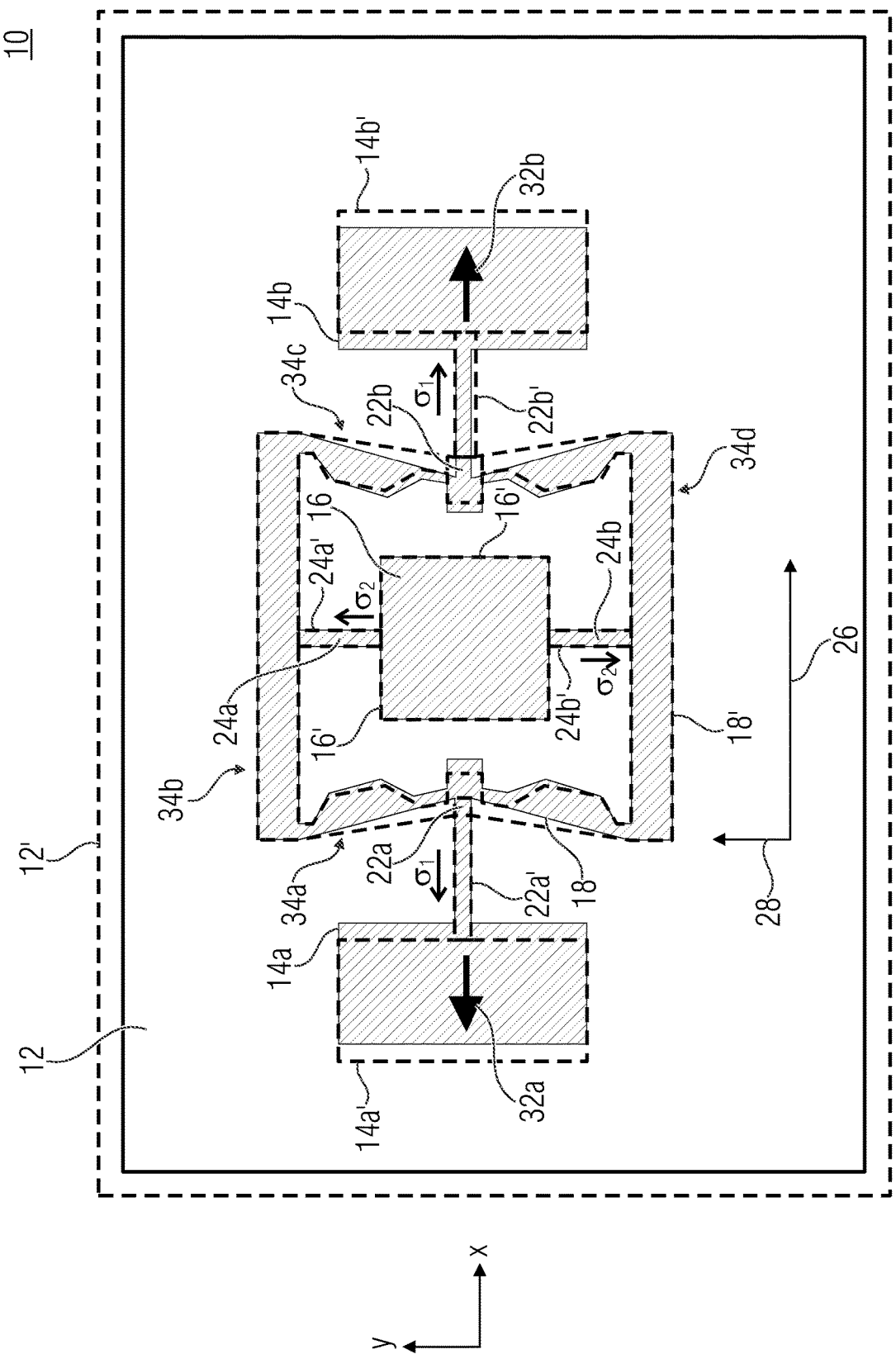
FIG. 1 is a schematic top view of an MMS according to an embodiment of the first aspect.

FIG. 1 shows a schematic top view of an MMS 10 according to an embodiment of the first aspect. Solid lines can show a state of the MMS prior to a release while dotted lines in FIG. 1 exemplarily show the state after the release. For clarity reasons, the reference numbers are provided with an apostrophe.

The MMS 10 includes a substrate 12. The substrate 12 can, for example, be a chip surface or the same. Anchor elements 14a and 14b can be elevated with respect to a substrate surface of the substrate 12 in order to allow spacing from the substrate surface and to provide, for example, a suspension for further components of the MMS 10. In the following, the anchor elements 14a and 14b are considered as part of the substrate 12, even when the same can be formed of different materials. Further, the MMS 10 includes a movable element 16 that is movable with respect to the substrate 12.

The MMS 10 can also include a frame structure 18 movable with respect to the substrate 12, which can also be referred to as gimbal frame. The MMS 10 includes springs 22a and 22b forming a first pair of springs. The springs 22a and 22b are arranged between the substrate 12 and the anchor elements 14a and 14b, respectively and the frame structure 18. The spring elements 22a and 22b support or carry the frame structure 18 with respect to the substrate 12. Springs 24a and 24b in turn connect the frame structure 18 to the movable element 16. For this, the springs 22a and 22b can be arranged along a first spring direction 26. For example, the springs 22a and 22b are arranged on opposite sides of the frame structure 18 and are oriented parallel to one another. The springs 22a and 22b can be arranged offset to one another along the spring direction 26 and/or can be arranged along a direction perpendicular thereto without any offset. Compared to the description in the context of FIG. 12b, the MMS 10 can be formed essentially in an identical manner, wherein at least the frame structure 18 is formed differently.

The springs 24a and 24b can be arranged along a second spring direction 28. The spring directions 26 and 28 can, for example, be arranged perpendicular to one another but can also have a different angle to one another. The springs 24a to 24b can also be arranged parallel to one another or merely offset to one another along the direction 28 without any offset along the direction 26. This allows gimbal suspension of the movable element 16 with respect to the substrate 12 by the frame structure 18. The obtained suspension can also be referred to as gimbal suspension, for example when the first pair of springs and the second pair of springs are arranged perpendicular to one another, wherein one of the pairs of springs is arranged at an inside of the frame structure 18 and the other pair of springs at the outside of the frame structure 18. The springs 22a, 22b, 24a and/or 24b can, for example, be formed as torsion springs or flexible springs.

The substrate 12, the anchor elements 14a and 14b, the movable element 16, the frame structure 18 as well as the springs 22a, 22b, 24a and 24b can include the same or differing materials. The above stated elements are illustrated in FIG. 1, for example, for a state prior to a release of the MMS, wherein sacrificial layers fixing the MMS are not illustrated for clarity reasons.

As indicated by arrows 32a and 32b, the anchor elements 14a and 14b, for example, shift along a positive and negative x direction. The x direction can be arranged parallel to the spring direction 26 of springs 22a and 22b in space, such that a tensile force on the spring elements 22a and 22b is generated by the displacement of the substrate 12 or the anchor elements 14a and 14b. This means that the x direction can also be arranged at a non-perpendicular angle to the spring direction 26.

Figure 12A:
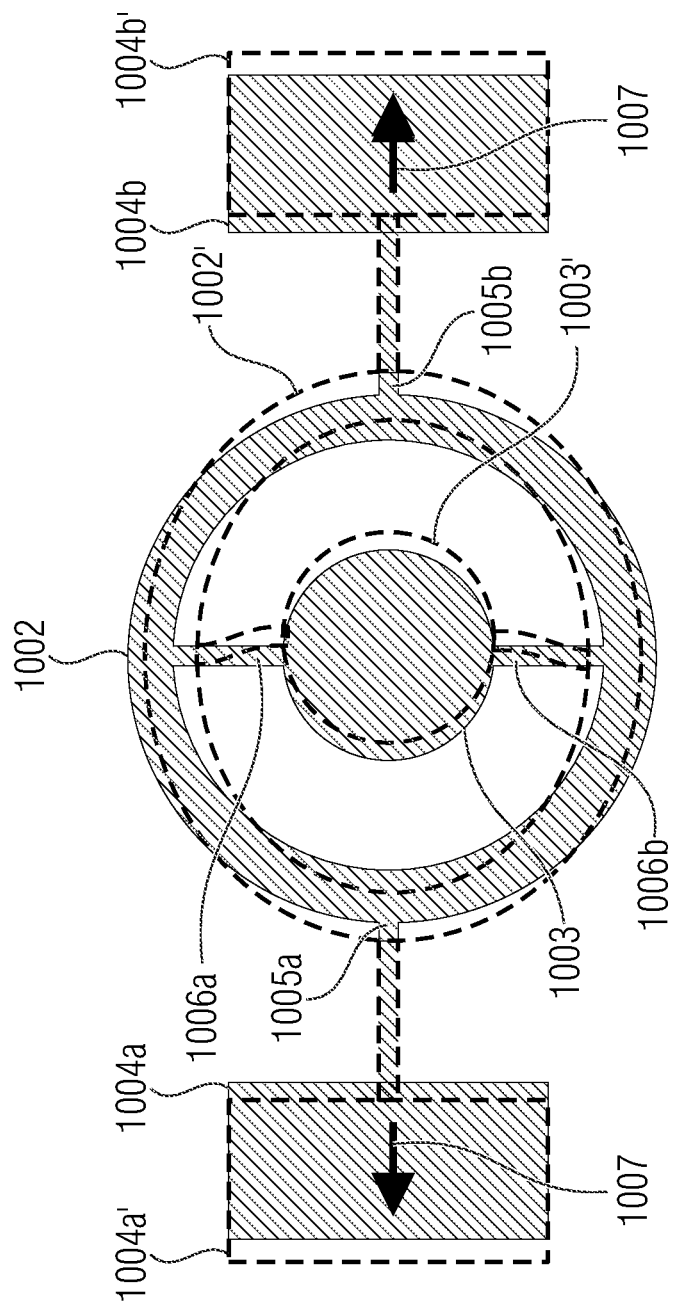
FIG. 12a-b is a behavior of an MMS according to conventional technology.
Figure 12B:
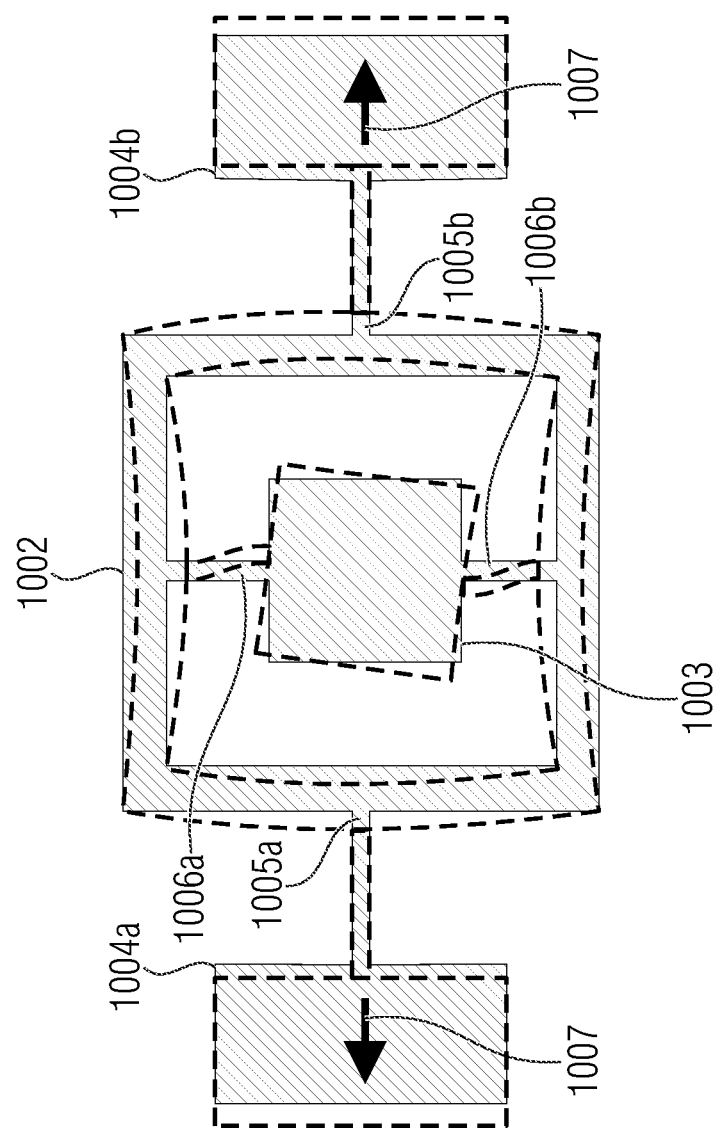

The frame structure 18 is configured to generate tensile stress $\sigma_2$ in the second pair of springs, i.e., springs 24a and 24b, when the tensile stress $\sigma_1$ acting in the springs 22a and 22b occurs. For this, the frame structure 18 can include four or more frame sides 34a to 34d. For example, the four illustrated sides 34a to 34d can be arranged in a parallelogram, a rectangle or, as illustrated, a square. The sides 34a and 34c can be arranged opposite to one another and can be connected to the anchor elements 14a and 14b, respectively, by means of springs 22a or 22b. Between these two sides, the sides 34b and 34d arranged opposite to one another can be arranged, which are connected to the movable element 16 via the spring elements 24a and 24b. The MMS 10 is configured such that the sides 34a and 34b are configured to expand when the tensile stress $\sigma_1$ occurs, this means sides 34a and 34b can be curved beforehand, wherein a degree of curvature is reduced by the resulting tensile forces, such that the ends of the sides 34a and 34c move away from each other and a distance of two outer ends of the sides 34a and 34c is extended due to the tensile stress $\sigma_1$. This means the frame structure 18 can be configured to expand along a direction perpendicular thereto, i.e., along the spring direction 28, when the tensile stress σ₁ occurs. The sides 34a and 34c can form, for example, a concave part of the frame structure, this means the sides 34a and 34c can, in a central area of the same, extend further into an inner area of the frame structure 18 than at an area of the sides 34a or 34c located further out, for example at ends of the same. Thereby, forces can be introduced into the frame structure 18 which push the two other sides 34b and 34d arranged opposite to each other apart, which acts as tensile force regarding the springs 24a and 24b and can generate the tensile stress σ₂. If, for example, the description of FIG. 12b is used as a comparison, it becomes clear that instead of the undesirable or damaging compressive force onto the spring elements 1006a and 1006b, a tensile force prevails in the spring elements 24a and 24b, which is desired or at least more tolerable than to the compressive force.

Although the MMS 10 is described such that the anchor elements 14a and 14b are arranged outside the frame structure 18 and the movable element 16 is arranged inside the frame structure 18, the operating modes of these elements can also be inter-exchanged. Without limiting the teachings described herein, it is possible that, for example, the elements 14a and 14b are connected to an element to be moved, such as a mirror or the same, while the element 16 is connected to the substrate 12 and acts as anchor element. Here, by the release, the tensile force inducing the tensile stress 6, can be obtained, for example when the frame structure 18 contracts with respect to the element to be moved (mirror).

This principle is particularly suitable for actuators tiltable in two dimensions, for example around an axis along the spring direction 26 and around an axis along the spring direction 28. In such actuators, the movement in the two degrees of freedom can be enabled by two pairs of springs that essentially extend at a right angle to each other. Here, possibly, each of these springs can also include a plurality of individual springs or can be split or divided into the same. The mechanical connection of the two pairs of springs can be generated via a frame that is quite rigid compared to the springs, i.e., the frame structure 18, and is also called gimbal suspension. It is possible that one of the pairs of springs engages at the outside of the gimbal frame and is anchored, for example at a substrate. The other pair of springs engages, for example, at the inside of the gimbal frame and holds the movable part of the actuator at the other end. In other embodiments, the roles of fixed substrate and any actuator part are reversed. Thus, a micromechanical gimbal suspension is provided where compressive stress in many or all parts, in particular in the springs 22a, 22b, 24a and 24b, could be prevented. This can also be maintained with parameter variations of the production process that are to be expected and under the operating conditions that are to be expected. By a suitable choice of design parameters, desired (tensile) stress values can be specifically adjusted in the different parts of the suspension. Examples thereof will be described below with reference to FIG. 2a.

Figure 13:
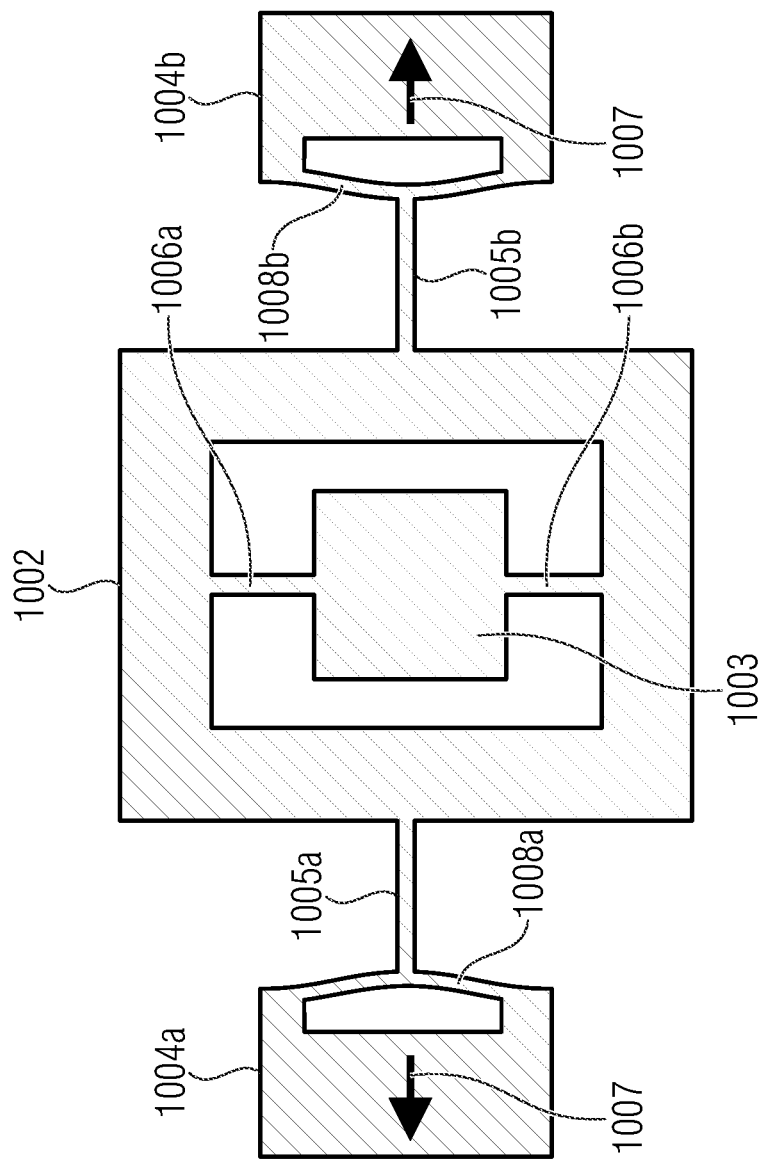
FIG. 13 is a further MMS according to conventional technology.

In other words, the above-stated problems can be solved in that the gimbal frame is formed partly in a concave manner, i.e., not convex in all positions and is configured to be weaker at the corners, i.e., in a thinned-out manner, such that the same can bend at these positions. Here, one of the pairs of springs engages at the concave thinned-out positions. In the MMS 10, the outer springs are arranged at the concave positions and engage there and are, on the other hand, anchored at the substrate. When here, for example, a tensile force is transmitted out of the substrate to the gimbal via the outer springs, the angle described in more detail with reference to FIG. 3 between the entering gimbal frame parts becomes more obtuse, i.e., larger, and the two other frame parts, i.e., sides 34b and 34d are pushed apart. In contrary to the MMS 10, known systems, such as the one illustrated in the context of FIG. 13, can reduce compressive stress but cannot convert the same into tensile stress.

Figure 2A:
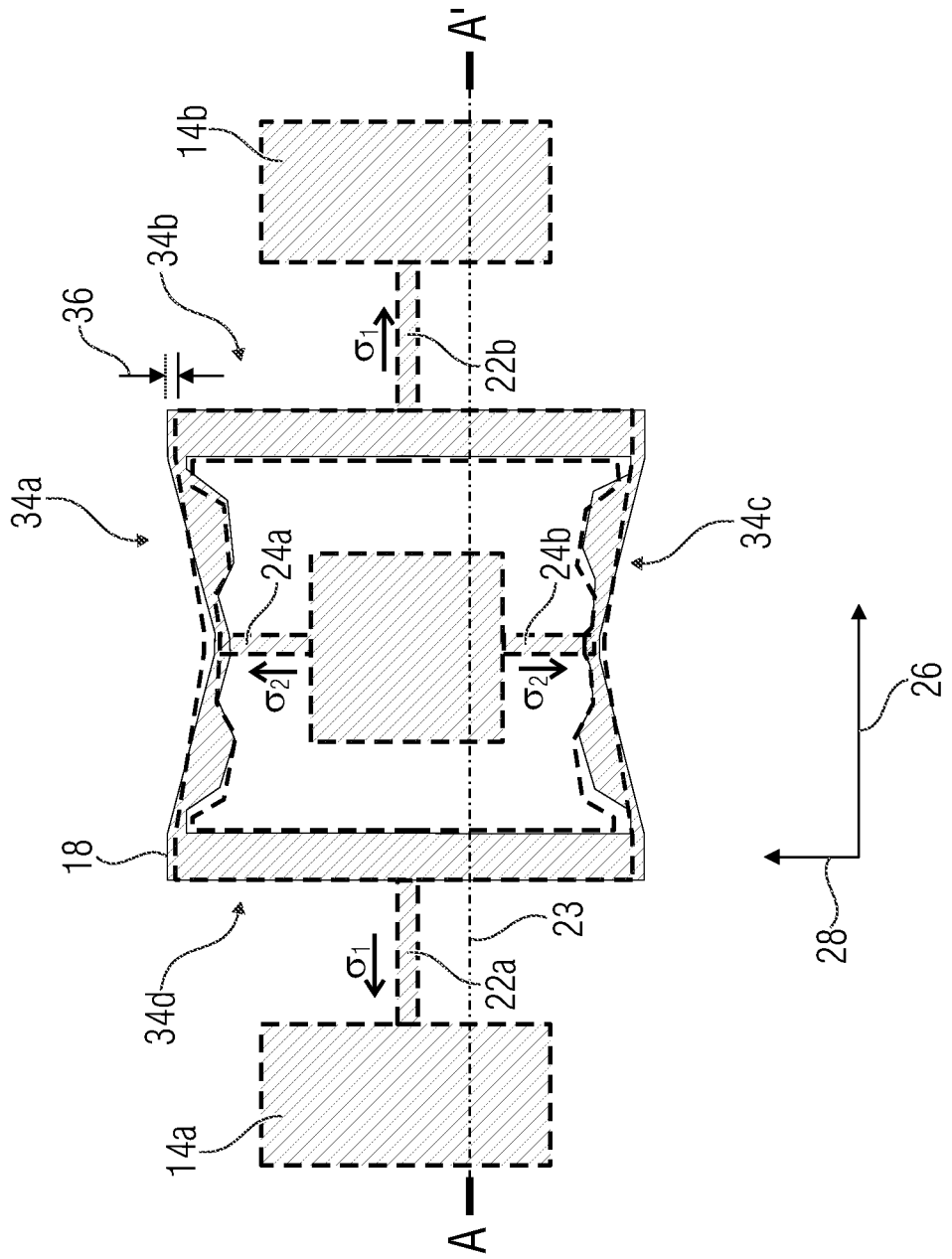
FIG. 2a is a schematic top view of an MMS according to a further embodiment of the first aspect.

FIG. 2a shows a schematic top view of an MMS 20 according to a further embodiment of the first aspect. While the MMS 10 is configured such that the springs 22a and 22b are arranged at comparatively soft sides 34a and 34c, the frame structure 18 of the MMS 20 further comprises two sides arranged opposite to one another that are comparatively soft, i.e., have low bending stiffness, between which two sides are arranged that are relatively stiff, i.e., have a comparatively high bending stiffness. The MMS 20 is configured such that the springs 22a and 22b engage at the stiff sides 34b and 34d, i.e., are connected the same. The tensile force occurring in this example due to shrinkage of the entire MMS with respect to the substrate has the effect that the centers of the soft sides 34a and 34c are pulled apart in order to provide the tensile force for the springs 24a and 24b. In contrary to that, in the MMS 10, the ends of the soft sides 34a and 34c are pushed apart. The sides 34b and 34d can form a concave part of the frame structure 18.

This means that the frame structure 18 can be configured such that a bending stiffness of the frame structure 18 along the spring direction 26 and the bending stiffness along the spring direction 28 differ from one another. The MMS 10 is configured, for example, such that the soft sides 34a and 34c run parallel to the spring direction 28, such that the frame structure 18 is formed in a soft manner along the spring direction 28 and is formed in a stiff manner along the spring direction 26. The situation is different in the MMS 20, where the soft sides are arranged along the spring direction 26, such that the bending stiffness of the frame structure 18 along the spring direction 28 is comparatively higher than the one of the frame structure along the spring direction 26. Compared to stiff sides 34b and 34d, the bending stiffnesses of the soft sides 34a and/or 34c can differ by a factor of at least 2, at least 3 or higher, for example at least 5 or at least 8, wherein a factor of 2, for example, is to be considered such that a stiff side comprises a stiffness which is at least twice the amount of the one of the soft side or such that the bending stiffness of a soft side has at least one half of a value of the bending stiffness of a stiff side.

In other words, FIG. 2a shows a different embodiment according to the first aspect. Here, the outer springs engage at the straight gimbal parts and the inner springs at the concave locations. The mode of operation is similar to the one described in the context of FIG. 1. The two examples also have in common that the frame structure 18 cannot be configured in a convex manner at all locations.

FIG. 2b shows a schematic side sectional view of the MMS 20 according to FIG. 2a in a sectional plane A-A' indicated by a line 23. The line 23 can be arranged parallel but adjacent to the springs 22a and 22b. The anchor plates 14a and 14b can be elevated or spaced apart with respect to a main substrate plane 25. An actuator 27 can be connected to the deflectable element 16 and can be configured to deflect the deflectable element 16. Springs 24 and the frame structure 18 are indicated by dotted lines outside the sectional plane A-A'.

An optional holding structure 29, such as a pole structure can be connected to the movable element 16 and an optional further movable structure 31, such as a micromirror or the same. The holding structure 29 and the further movable structure 31 can be formed of the same or different materials, such as including silicon and/or a metal such aluminum, titan, gold or silver or a metal alloy and/or compounds, specifically oxides or nitrides such as titan nitride or aluminum oxide. A movement of the moveable element 16 can induce a movement of the further movable structure 31 or vice versa, this means a sensor can be arranged instead of the actuator 27. Alternatively, the anchor plates 14a and 14b can also be movable with respect to the substrate 12 while the same are mounted at the substrate 12 instead of at the actuator 27.

The spacing of the anchor plates 14a and 14b from the substrate 12 can be configured the same way in the other MMS described herein, such as the MMS 10. Although the substrate 12 is illustrated such that the same has an elevation with respect to the plane 25, these elevations can also be part of the anchor plates 14a and/or 14b. Alternatively or additionally, the anchor plates can also include a substrate material of the substrate 12 and/or can be formed integrally with the same. Due the arrangement of the actuator 27, the MMS 20 can also be referred to as MEMS.

Figure 3:
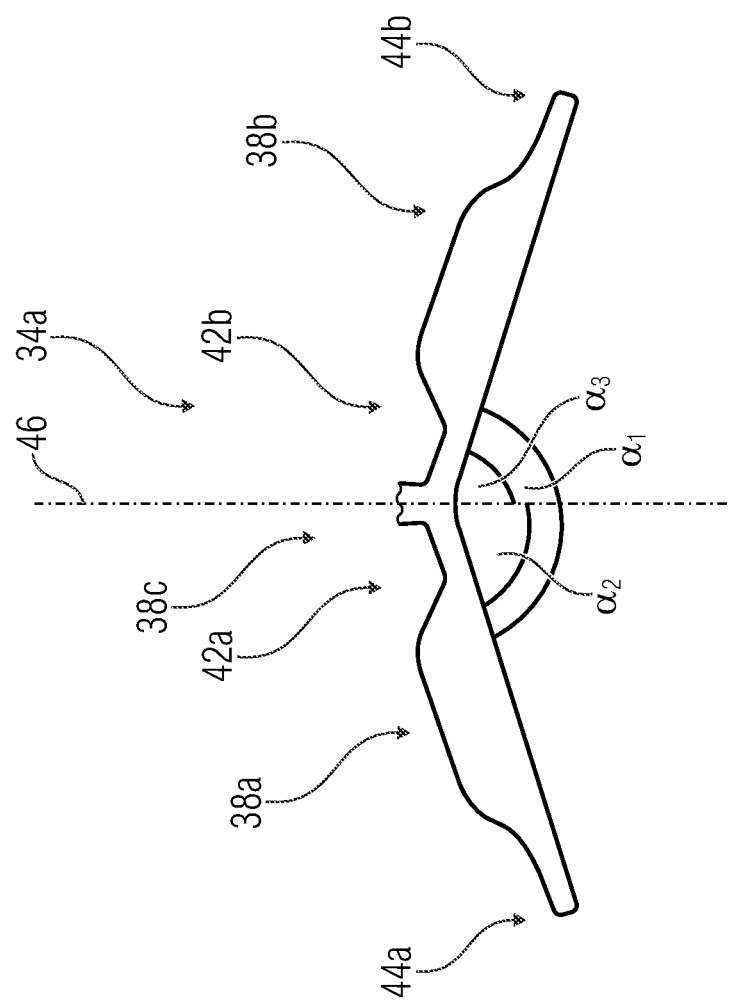

FIG. 3 shows a schematic top view of a particularly advantageous implementation of a soft side of the frame structure 18 as it can be used, for example, as side 34a of the frame structure 18 in the MMS 10 or 20. The side 34a of the frame structure 18 can comprise two or more partial areas 38a and 38b. The partial areas 38a and 38b can be connected at a partial area 38c, which can also be described as center area. The outer spring 22a can be arranged at the central area 38c as it is illustrated for the MMS 10, or, the inner spring 24a can be arranged, as it is illustrated for the MMS 20. The partial areas 38a and 38b can be configured in a relatively stiff manner in a central part thereof, such as by a width that is relatively large compared to other areas of the same.

The side 34a can be thinned out between the partial areas 38a and 38b or between a respective partial area 38a and 38b and the central area 38c, such that a flexure hinge is formed in thinned out areas 24a and 24b. This means that the frame structure can be configured as flexure hinge in an area where a spring of the first or second pair of springs is arranged. The flexure hinges can be arranged at the soft side 34a, i.e., along the side of the frame structure along which the bending stiffness of the frame structure has a comparatively low value. The partial areas 38a and 38b can be movable with respect to one another via one or several flexure hinges. This allows movement of the partial areas and hence the frame structure while preventing structural damages in the frame structure 18.

The partial areas 38a and 38b can be arranged with respect to one another at an angle $\alpha_1$ that is unequal to 180°. This relates to the angle between the partial areas 38a and 38b having the smaller value. It is obvious that at an angle of unequal 180° a further angle can be considered on the other side that is greater than 180° at the same time. Here, the angle $\alpha_1$ that is smaller than 180° relates to an outside of the frame structure 18, i.e., an angle measured on the outside. The side 34a can be formed symmetrically with respect to an axis 46, such as along a course of a spring arranged in the area 38c, such that an angle $\alpha_2$ between the partial area 38a and the axis 46 is equal to an angle $\alpha_3$ between the partial area 38b and the axis 46. Alternatively, the side 34a can also be formed asymmetrically, such that the angles $\alpha_2$ and $\alpha_3$ differ from one another. The arrangement of the partial areas 38a and 38b with respect to one another such that the arrangement encloses an angle $\alpha_1$ measured outside with respect to the frame structure can also be referred to such that the partial areas 38a and 38b form a concave part or concave side of the frame structure.

By the occurrence of the tensile force, the side 34a can be deformed, which pulls or presses the ends 44a and 44b of the side 34a apart. At the ends 44a and 44b, the side 34a can also be thinned out in order to implement a flexure hinge, such that a flexure hinge is arranged in the frame structure 18 between two adjacent sides. This means that the frame structure is configured as flexure hinge between a side where a spring of the first pair of springs is arranged and a side where a spring of the second pair of springs is arranged and between a further side where a further spring of the first pair of springs is arranged and a further side where a further spring of the second pair of springs is arranged.

Compared to the reinforced partial areas 38a and 38b, the flexure hinges 42a and 42b can also be considered such that the frame structure has a higher flexibility at two opposing sides of the frame structure in an area where a spring of the first or second pair of springs is arranged compared to an adjacent area 38a and/38b.

When considering FIGS. 1 and 2 again, two opposing sides of the frame structure can be formed with a bending stiffness which is essentially the same. Although MMS described herein are described such that the frame structure has four sides, such that a parallelogram and as a specific form thereof a rectangle or square can be obtained, it is also possible that the frame structure is formed as polygon having any even number of sides, such as 6, 8, 10 or more. Here also two respectively opposing sides can be considered.

The frame structure 18 is formed symmetrically along the first spring direction 26 as well as along the second spring direction 28, which allows identification of two opposing sides. The side 34a illustrated in more detail in FIG. 3 can be seen as a side having a discontinuously curved course. The partial areas 38a and 38b can each be essentially implemented in a straight manner and can be arranged at an angle to one another, such that the side 34a as a whole has a curved course even when the same results due to a discontinuous change of the direction within the side 34a.

In other words, by selecting the original angle $\alpha_1$ of the re-entering gimbal frame parts prior to the release, the value of the resulting width of the frame at the corners and hence, a desired slight tensile stress in the inner springs can be adjusted as desired. The angle determines by level principles how much force is introduced into the frame structure by the tensile force. By material selection and selection of the frame geometry, the deformation of the frame and hence the tensile force onto the inner springs can be determined. The less obtuse the angle $\alpha_1$, the stronger the widening of the frame due to the tensile stress of the outer springs and the higher the tensile stress in the inner springs. Thereby, the object of preventing compressive forces on the inner springs can be solved. Since the gimbal frame as a whole gives in to the tensile force of the outer springs in a defined manner, the remaining tensile stress can be adjusted to an advantageously small portion of the initial value by selecting the stiffness of the corner connections (hinges or flexure hinges) of the gimbal frame. Particularly thin soft corner connections allow soft bending and leave a smaller part of the tensile stress. However, it has to be considered that the stresses of the two pairs of springs influence each other since the same are connected via the frame structure 18. The described geometry of a gimbal suspension is also suitable to improve the characteristics of the system in other load situations. If, for example, the gimbal is under tensile stress due to production reasons and something contracts during release, tensile force is applied to the same via the rigid substrate. Again, the angular parts of the frame would be slightly expanded and hence, counteract contraction and generation of compressive stress in the inner springs. Instead, balanced tensile stress distribution in the two pairs of springs results again, in contrary to known concepts.

Figure 4:
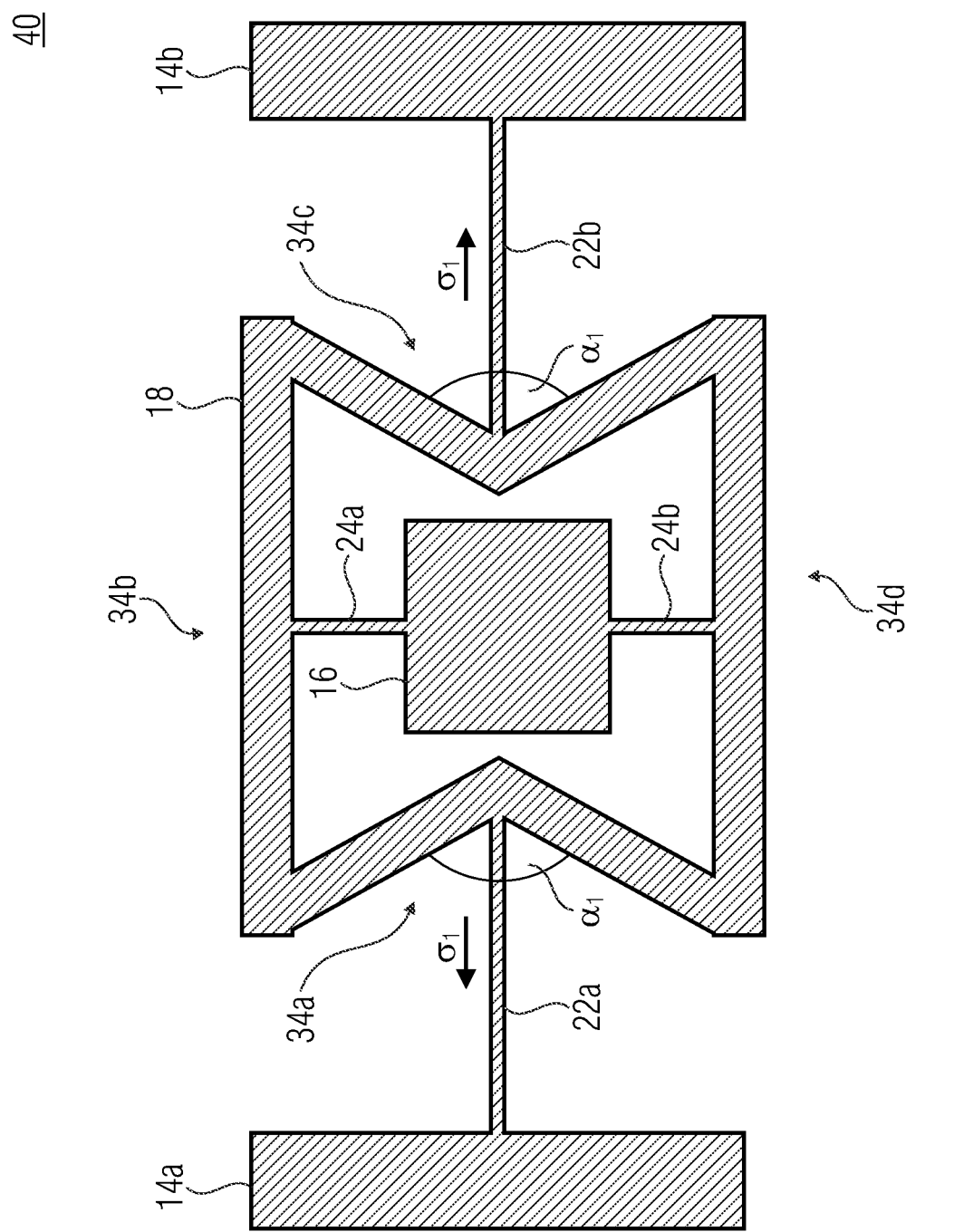
FIG. 4 is a schematic top view of an MMS according to a further embodiment of the first aspect where ends of sides of the frame structure are pushed apart when tensile forces occur.

FIG. 4 shows a schematic top view of an MMS 40 according to a further embodiment where the ends of the sides 34a and 34c are pushed apart based on the tensile force. The sides 34a and 34c are formed of at least 2 straight segments arranged at an angle to one another. The segments are arranged such that the same enclose the angle $\alpha_1$.

Figure 5:
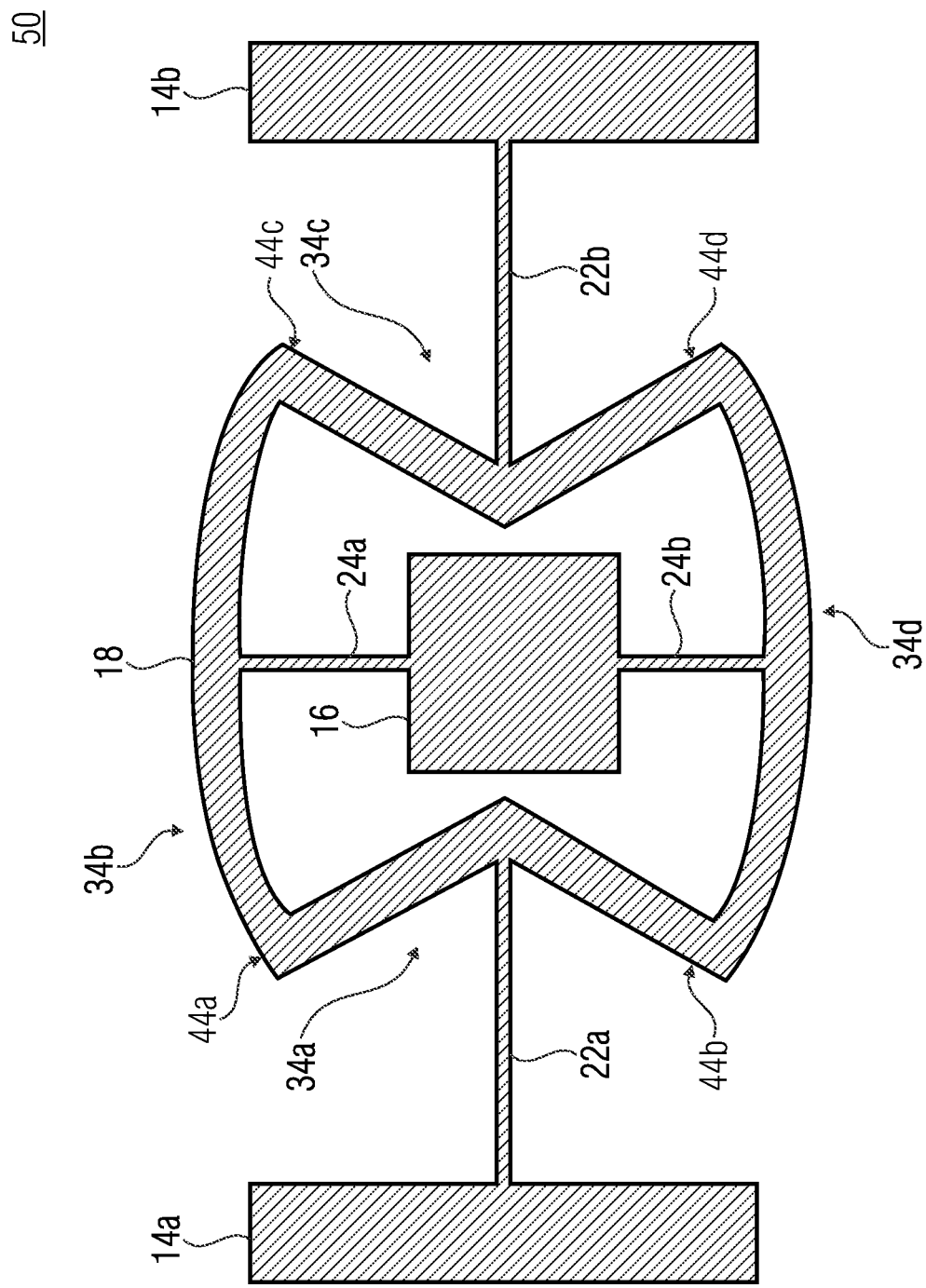
FIG. 5 is a schematic top view of an MMS according to a further embodiment of the first aspect where two sides of the frame structure are formed as beams curved to the outside compared to the MMS according to FIG. 4.

FIG. 5 shows a schematic top view of an MMS 50 where the sides 34b and 34d are formed as beams curved to the outside compared to the MMS 40. This means that the opposing sides 34b and 34d can be described as having a continuously curved course. The sides 34b and 34d curved to the outside can act as arch or bridge structure and allow high transmission of forces to the spring elements 24a and 24b since bending of the curved elements compared to the elements configured in a straight manner can be low. Hinges or flexure hinges can be arranged at ends 44a to 44d of sides 34a and 34c in order to simplify deformation at adjacent sides. The sides 34a and 34c can form a concave part of the frame structure.

Figure 6:
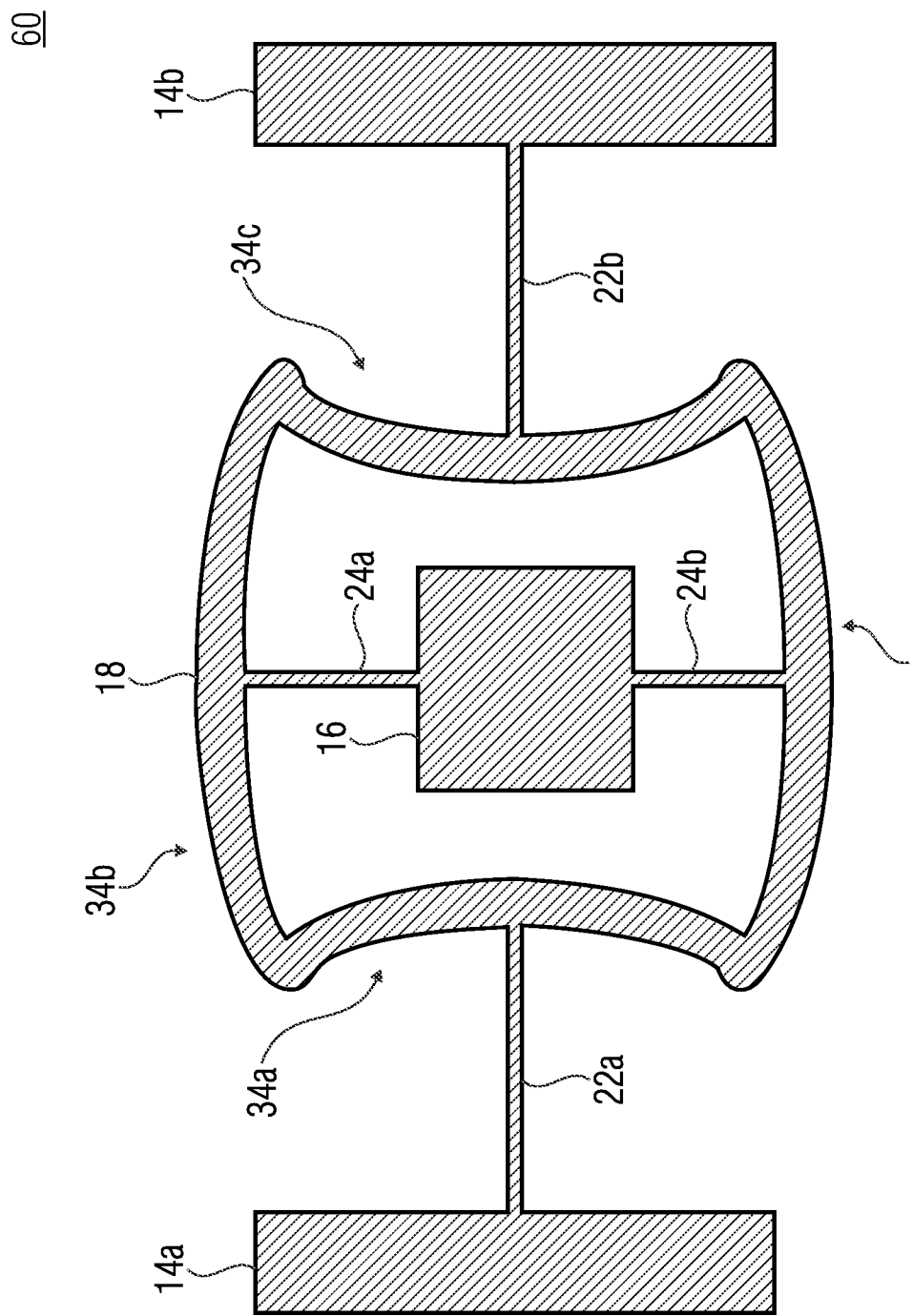
FIG. 6 is a schematic top view of an MMS according to a further embodiment of the first aspect where four sides of the frame structure are realized as curved arches.

FIG. 6 shows a schematic top view of an MMS 60 according to further embodiment of the first aspect wherein the sides 34b and 34d are realized as arches curved to the outside while the sides 34a and 34c are realized as arches curved to the inside. The continuous curvature of the sides 34a and 34c allows a similar effect as the implementation of the angle $\alpha_1$ between partial areas of the sides formed in a convex manner in areas as described for the MMS 10 and 20. It is an advantage of the MMS 60, for example, that simple structures can be implemented. The sides 34a and 34c can form a concave part of the frame structure.

Figure 7:
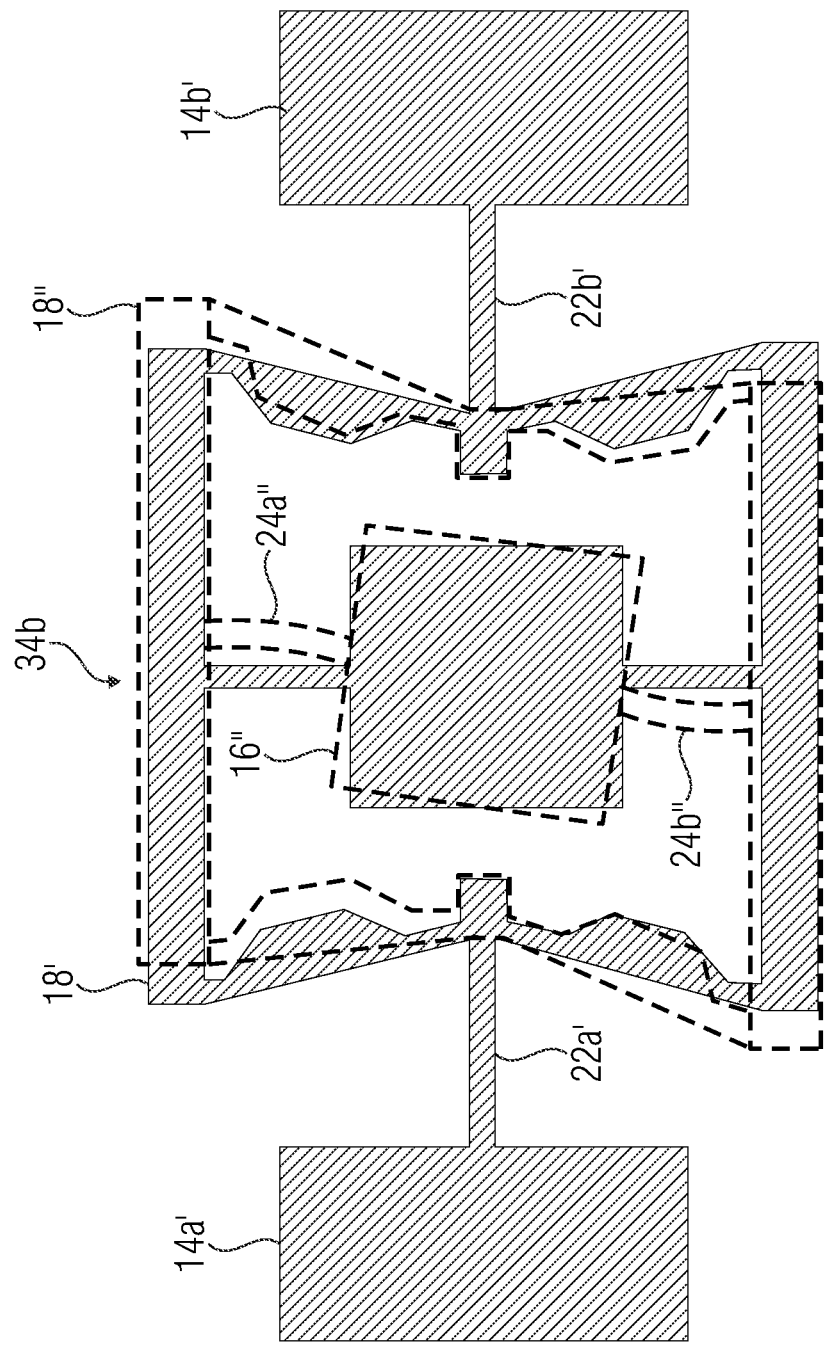
FIG. 7 is a schematic top view of the MMS according to FIG. 1 brought into an undesired deformation according to an embodiment of the first aspect.

FIG. 7 shows a schematic top view of the MMS 10 brought into an undesirable deformation as illustrated by reference numbers 16", 18", 24a" and 24b". The flexible corner connections as described, for example, in the context of MMS 10 and MMS 20 and that are arranged between two adjacent sides of the frame structure 18 can, in some operating situations, have the effect that an undesired deformation of the gimbal frame 18 takes place, as indicated for the frame structure 18". Such deformations can, for example, be excited dynamically and can interfere with the proper function of the member.

Figure 8:
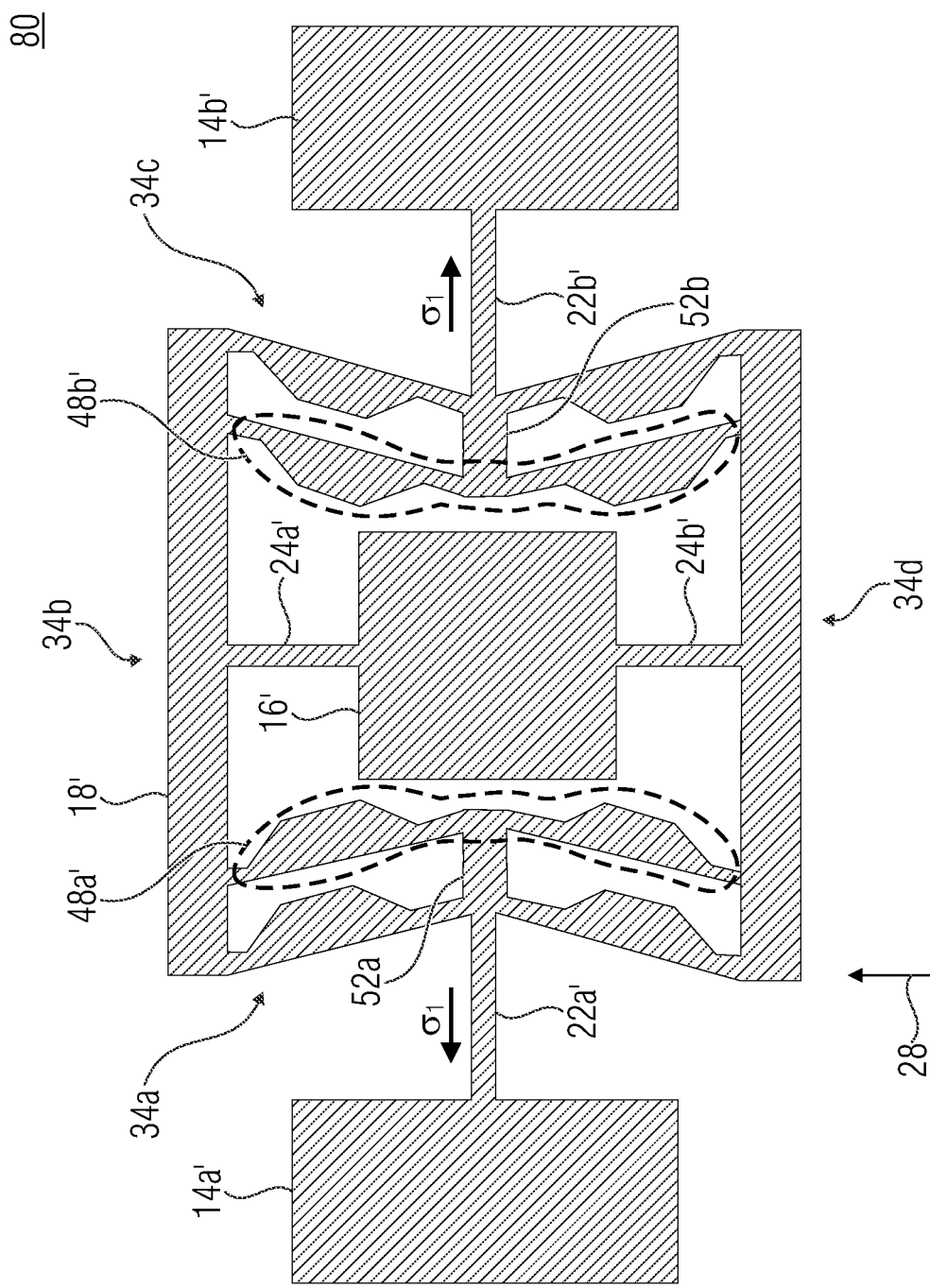
FIG. 8 is a schematic top view of an MMS according to an embodiment of the first aspect having compensation structures.

FIG. 8 shows a schematic top view of an MMS 80 according to an advantageous embodiment of the first aspect comprising compensation structures 48a' and 48b'. The compensation structure 48a' can, for example, be configured in the same way as the side 34a having a comparatively low bending stiffness. Also, the compensation structure 48b' can be structured in the same way as the side 34b of the frame structure 18'. Simply put, the compensation structures 48a' and 48b' can, be arranged parallel to the sides 34a and 34c and between the sides 34b and 34d. This means that the compensation structures 48a' and 48b' can be mechanically fixed to the sides 34b and 34d. Advantageously, the compensation structures 48a' and 48b' are arranged along the sides along which the frame structure 18' has the lower bending stiffness. Most advantageously, the compensation structures 48a' and 48b' are arranged in parallel to the soft sides 34a and 34c, i.e., sides 34a and 34c are implemented twice or even multiple times such that forces can be guided in parallel.

The side 34a can be connected to the compensation structure 48a' via a connecting element 52a essentially extending along the spring direction 26 in order to allow direct force application of the tensile force to the compensation structure 48a' even in a central area of the same. Also, a connecting element 52b can be arranged between the compensation structure 48b' and the side 34c.

Although the MMS 80 is described such that each of the sides 34a and 34c is implemented twice, also, merely one of the sides can have a compensation structure. Alternatively or additionally, at least one of the sides can be implemented threefold, at least fourfold or with a higher value.

In other words, the deformation according to FIG. 7 can be counteracted in that at least part of the re-entering frame parts is implemented twice or multiple times and hence parallel guidance is provided. Thus, FIG. 8 shows stabilization against undesired deformation of the gimbal frame, illustrated in FIG. 7, by duplicated frame parts, wherein double or multiple implementation on one side can also be sufficient. Depending on the expected load cases, the shape of the gimbal to be selected can also deviate. Each case, the configuration with concave portions according to MMS 10 and MMS 20 but also of the other embodiments described herein, where some of the springs engage, allows positive influence on the resulting stress distribution and in particular the prevention of compressive stresses in the thin springs. Optimization of basic form angles or corner connecting strength can be performed by means of FEM simulation.

Embodiments of the first aspect described herein allow the generation of MMS and/or MEMS actuators with gimbal suspension that are significantly less sensitive to mechanical stress than the versions known so far. Thereby, in particular, buckling of the sensitive springs can be prevented and the member can be produced in a further process window and can be operated under widely varying conditions. For that, the embodiments according to the first aspect generally need no additional production steps or process changes. Merely one design optimization, which might be expensive, is needed for improving the characteristics. These embodiments can also be used for self-supporting parts of a microsystem that are not intended for movements. The above so-called springs would then simply be weak system elements that cannot be stabilized easily against buckling for other reasons.

Figure 9:
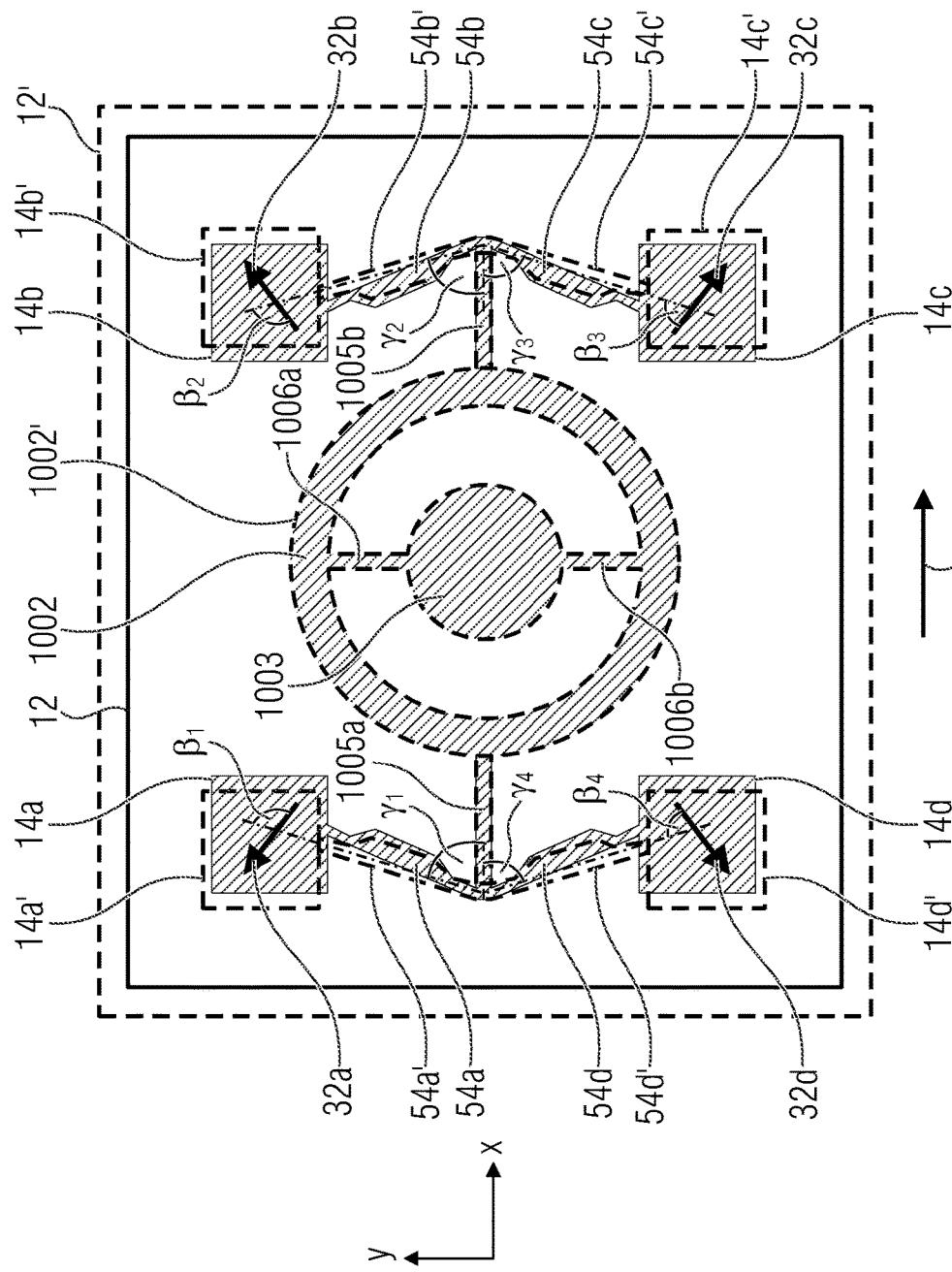
FIG. 9 is a schematic top view of an MMS according to an embodiment of the second aspect.

FIG. 9 shows a schematic top view of an MMS 90 according to an embodiment of the second aspect. According to the second aspect, the object of at least reducing the tensile stress on springs 1006a and 1006b within the gimbal frame 1002 is effected by an amended connection of the outer springs 1005a and 1005b to the substrate 12. The MMS 90 includes the substrate 12 and the movable element 1003 described in the context of FIG. 12a and connected to the frame structure 1002 via springs 1006a and 1006b. Without limitations, the frame structure 1002 can also be formed as frame structure 18. The springs 1006a and 1006b can be the springs 24a and 24b. Alternatively or additionally, the springs 1005a and 1005b can be the springs 22a and 22b. Different to the situation described in the context of FIG. 12a, the MMS 90 comprises at least four anchor areas 14a to 14d. By the expansion of the substrate 12 along the x and y direction, such as by heating or by force application, for example during release, displacement of the anchor elements 14a to 14d can have one directional component each along the x and y direction as indicated by obliquely drawn directional arrows 32a to 32d pointing away from the moveable element 1003. A displacement direction of the anchor element 14a indicated by the arrow 32a can be opposite to a direction of movement of the anchor element 14c indicated by arrow 32c, as well as the directions of movement of the anchor elements 14b and 14d. This means that due to the expansion, as well as during contraction of the substrate 12, the anchor elements 14*a* to 14*d* are displaced with respect to one another and with respect to the movable element 1003 and the frame 1002, respectively.

The anchor elements 14*a* to 14*d* can be spaced apart from the substrate 12 as described with reference to FIG. 2*b*.

The MMS includes lever elements 54*a* to 54*d*, wherein one lever element 54*a* is arranged between an end of the spring 1005*a* facing away from the frame structure and the anchor area 14*a*, and the lever element 54*d* is arranged between the same end the anchor element 14*d*. This means the end of the spring 1005*a* facing away from the frame 1002 is connected to an anchor element 14*a* and 14*d*, respectively, by one lever element 54*a* and 54*d*, respectively. In the same way, an end of the spring 1005*b* facing away from the frame 1002 with the lever elements 54*b* and 54*c* is arranged at the anchor areas 14*b* and 14*c*, respectively. The lever elements 54*a* to 54*d* can each be configured as partial area 38*a* or 38*d*, but can alternatively also have a different configuration, such as continuously or discontinuously curved, straight, having a variable or constant width or thickness. A combination of two adjacent lever elements 54*a* and 54*b* can be configured as described in the context of FIG. 3 for the side 34*a*.

An arrangement of the lever elements 54*a* to 54*d* at the respective anchor area 14*a* to 14*d* can be such that the lever element 54*a* to 54*d* is arranged at an angle $\beta_1$ to $\beta_4$ of 90°±20° (i.e., of at least 70° and at most 110°), of 90°±15° (i.e., of at least 75° and at most 105°) and most advantageously of 90°±10° (i.e., of at least 80° and at least 100°) with respect to the displacement direction. An angle $\beta_1$ to $\beta$ of 90° between the displacement direction of the respective anchor element 14*a* to 14*d* and the lever element arranged thereon is particularly advantageous, wherein the angle $\beta_1$ to $\beta_4$ is variable by displacing the anchor elements. In that way, the angle $\beta_1$ to $\beta_4$ can be slightly greater or slightly smaller than 90° and have the value of 90° during the displacement in order to subsequently decrease or increase further. In other words, the angles $\beta_1$ to $\beta_4$ can be configured such that during the displacement between the positions of the anchor elements 14*a*/14*a*', 14*b*/14*b*', 14*c*/14*c*' and 14*d*/14*d*' the angle of 90° is obtained, i.e., is slightly greater or smaller beforehand, then assumes the value of 90° and subsequently increases or decreases again.

Based on such a symmetrical configuration of the MMS, the end point of the springs is also essentially stationary, i.e., only displaced to a small extent. Thereby, the springs 1005*a* and 1005*b* can essentially have an unamended position during the expansion of the substrate 12, this means a position of the frame 1002 as well as shape of the same can essentially be unamended.

The described orientation of the lever elements 54*a* to 54*d* allows that the displacement of the anchor elements 14*a* to 14*d* relative to the ends of the springs 1005*a* and 1005*b* facing away from the frame 1002 is configured such that small force is generated along the x direction and along the spring direction 26, respectively, such that even in classical frames 1002 only a small or no force is applied to the inner spring 1006*a* and 1006*b*. The force can act along the respective positive and/or negative directional component.

An angle $\gamma_1$ to $\gamma_4$ between the lever element and the respective outer spring 1005*a* and 1005*b*, respectively, can result due to the configuration of springs 1005*a* and 1005*b*, such as due to deflection amplitudes or the same and/or due to positioning of the anchor elements 14*a* to 14*d*. The lengths and positions of the individual elements are configured such that the angles $\gamma_1$ to $\gamma_4$ have a value of at least 25° and at most 65° to one another.

The MMS 90 can comprise the frame structure 18. The configurations discussed in the context with the first aspect can be combined with the second aspect without limitations. This means the MMS 90 can, for example, be configured, such that the frame structure 18 is arranged and configured to generate tensile stress in the springs 1006*a* and 1006*b* when tensile stress exists in the springs 1005*a* and 1005*b*. Alternatively or additionally, the anchor areas or anchor elements described in the context of the MMS 10, 20, 40, 50, 60, 70 and 80 can also be configured according to the MMS 90, i.e., a higher number of anchor elements can be arranged, wherein one lever element each is connected to an end of the spring facing away from the frame structure and an anchor element, wherein a geometrical arrangement of the lever element in space is configured such that merely a low degree of compressive forces is applied to other MMS parts.

Figure 10:
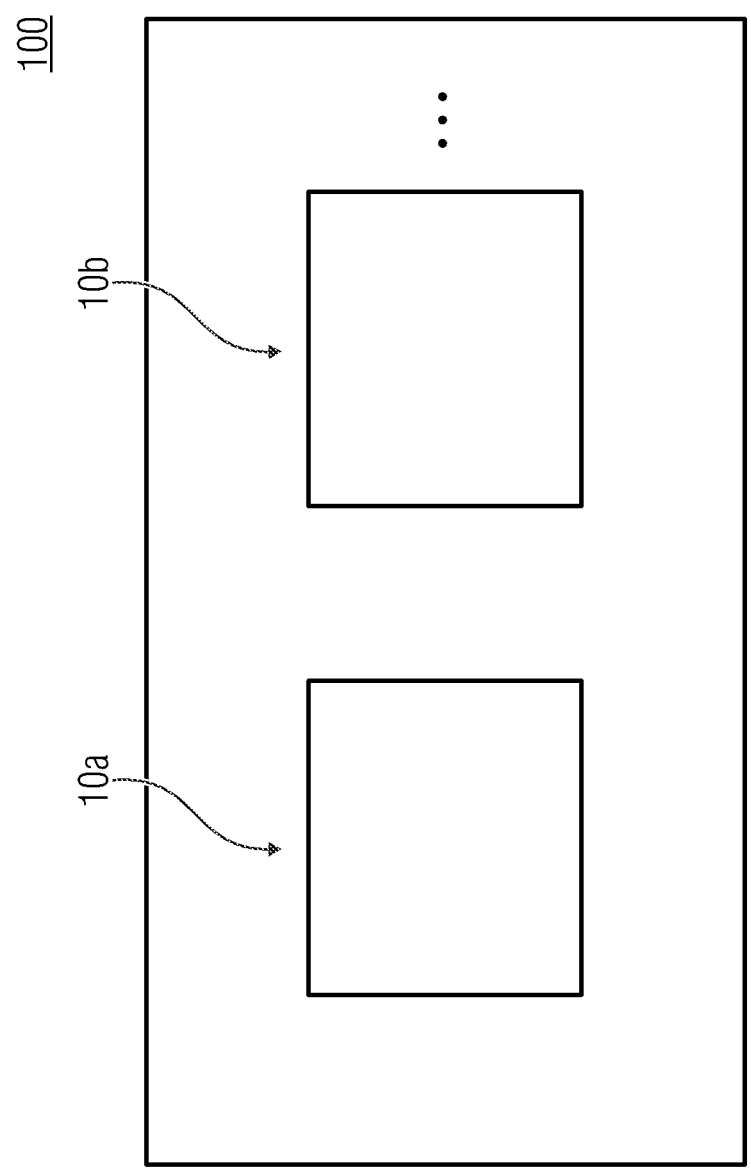
FIG. 10 is a schematic block diagram of an MMS array according to an embodiment.

FIG. 10 shows a schematic block diagram of an MMS array with a plurality of MMS according to one or several of the above explained embodiments. The MMS array 100 comprises, for example, two MMS, wherein also any higher number can be arranged, for example at least three, at least five or at least ten or even more. The MMS of this arrangement can be in one row or can also be distributed throughout the area. An arrangement in regular rows and columns with many MMS, for example at least 100 or several hundred rows and/or at least 100 or more or several hundred columns is advantageous. For example, an MMS 10*a* and an MMS 10*b* are arranged that are each configured like the MMS 10. Alternatively or additionally, at least one of the MMS 10*a*, 10*b* or possibly the further MMS can be configured as a different MMS described herein, for example the MMS 20, 40, 50, 60, 70, 80 and/or 90.

Figure 11:
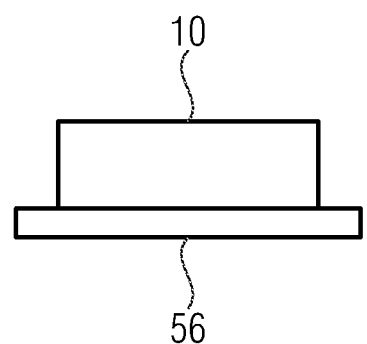
FIG. 11 is a schematic block diagram of an MMS actuator according to an embodiment.

FIG. 11 shows a schematic block diagram of an MMS actuator 110 according to an embodiment. The MMS actuator 110 includes an MMS or an MMS array according to embodiments described herein and further comprises an actuator element 56. The actuator element 56 can be any element for application of force or energy allowing deflection of the movable element of the MMS. For example, it can be an electrostatic actuator consisting of two parallel electrode plates or a thermal element for heating or cooling parts of the MMS 10 or the substrate 12, wherein also other elements can be heated. Alternatively or additionally, a force member can, for example, be arranged as piezoelectric force member. Alternatively or additionally, the MMS actuator 110 can comprise a different MMS, such as the MMS 20, 40, 50, 60, 70, 80 and/or 90 or can comprise the MMS array 100. The MMS actuator can also be referred to as MEMS or as MEMS actuator.

In other words, embodiments described herein are suitable for micromechanical systems, in particular for gimbal suspended actuators. Thus, embodiments of the present invention relate to the construction of a micromechanical or MEMS actuator. Embodiments improve the characteristics of known suspensions in micromechanical systems. They can also be useful for elements having a similar geometry, even when the same are not intended for tilting movements, possibly not even intended for movements at all, i.e., positioned in a static manner.

Although some aspects have been described in the context of an apparatus, it is obvious that these aspects also represent a description of the corresponding method, such that a block or device of an apparatus also corresponds to a respective method step or a feature of a method step. Analogously, aspects described in the context of a method step also represent a description of a corresponding block or detail or feature of a corresponding apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

LITERATURE

1. Landau L. D., Lifschitz E. M., "Theory of elasticity", Pergamon Press, London, 1959
2. Wikipedia 'Euler column'

The invention claimed is:

1. Micromechanical structure, MMS, comprising:
   a substrate;
   an element moveable with respect to the substrate;
   a frame structure;
   a first pair of springs arranged between the substrate and the frame structure along a first spring direction; and
   a second pair of springs arranged between the movable element and the frame structure along a second spring direction;
   wherein the frame structure is configured to generate tensile stress in the second pair of springs at tensile stress acting in the first pair of springs;
   wherein a first and a second side of the frame structure where one spring each of one of the two pairs of springs is arranged comprise a first partial area and a second partial area between which the respective spring is arranged, wherein the first and the second partial area are arranged at an angle of less than 180° measured outside with respect to the frame structure.

2. MMS according to claim 1, wherein a distance of two outer ends of two opposing sides of the frame structure are extendable based on the tensile stress acting in the first pair of springs in order to generate the tensile force in the second pair of springs.

3. MMS according to claim 1, wherein a first element of the group of the moveable element and the substrate is surrounded by the frame structure and wherein two opposing sides of the frame structure comprise a continuously or discontinuously curved course in a released state of the frame structure.

4. MMS according to claim 1, wherein a first and a second side of the frame structure where one spring each of the first pair of springs is arranged comprise a first partial area and a second partial area between which the respective spring is arranged, wherein the first and the second partial area are arranged at an angle of less than 180° measured outside with respect to the frame structure.

5. MMS according to claim 1, wherein a third and a fourth side of the frame structure where one spring each of the second pair of springs is arranged comprise a first partial area and a second partial area between which the respective spring is arranged, wherein the first and second partial area are arranged at an angle of less than 180° measured outside with respect to the frame structure.

6. MMS according to claim 1, wherein a bending stiffness of the frame structure along the first spring direction and along the second spring direction differ from each other.

7. MMS according to claim 1, wherein the frame structure is formed as structure comprising an even number of corner points, wherein one side of the frame structure is arranged between two adjacent corner points, wherein a bending stiffness of two opposing sides is essentially the same.

8. MMS according to claim 1, wherein the frame structure shows higher flexibility on two opposing sides of the frame structure in an area where a spring of the first or second pair of springs is arranged than in an adjacent area.

9. MMS according to claim 1, wherein the frame structure is configured as flexure hinge in an area where a spring of the first or second pair of springs is arranged.

10. MMS according to claim 1, wherein the frame structure is configured as flexure hinge between a first side where a first spring of the first pair of springs is arranged and a third side where a first spring of the second pair of springs is arranged, and between a second side where a second spring of the first pair of springs is arranged and a fourth side where a second spring of the second pair of springs is arranged.

11. MMS according to claim 1, wherein the frame structure is formed axisymmetrically with respect to the first spring direction and axisymmetrically with respect to the second spring direction.

12. MMS according to claim 1, wherein springs of the first pair of springs are arranged parallel and offset to one another along the first spring direction and wherein the springs of the second pair of springs are arranged parallel and offset to one another along the second spring direction.

13. MMS according to claim 1, wherein a first spring of the first pair of springs at an end facing away from the frame structure is connected to a first anchor area of the substrate via a first lever element and to a second anchor area of the substrate via a second lever element, and wherein a second spring of the first pair of springs at an end facing away from the frame structure is connected to a third anchor area of the substrate via a third lever element and to a fourth anchor area of the substrate via a fourth lever element;
   wherein the first, second, third and fourth anchor area are displaceable with respect to one another along a first, second, third and fourth displacement direction when the substrate expands; and
   wherein each of the lever elements is arranged at an angle of at least 70° and at most 110° at the respective anchor area relative to the displacement direction.

14. Micromechanical structure, MMS, comprising;
   a substrate;
   an element movable with respect to the substrate;
   a frame structure;
   a first and a second spring arranged between the substrate and the frame structure along a first spring direction; and
   a third and fourth spring arranged between the movable element and the frame structure along a second spring direction;
   wherein the first spring at an end of the frame facing away from the frame structure is connected to a first anchor area of the substrate via a first lever element and to a second anchor area of the substrate via a second lever element, and wherein the second spring at an end facing away from the frame structure is connected to third anchor area of the substrate via a third lever element and to a fourth anchor area of the substrate via a fourth lever element;
   wherein the first, second, third and fourth anchor area is displaceable with respect to one another along a first, second, third and fourth displacement direction when the substrate expands; and wherein each of the lever elements is arranged at an angle of at least 70° and at most 100° at the respective anchor area relative to the displacement direction.

15. MMS according to claim 14, wherein the first and the second lever element are arranged at an angle of at least 25° and at most 65° to the first spring at an end of the first spring facing away from the frame structure, and wherein the third and the fourth lever element are arranged at an angle of at least 25° and at most 65° to the second spring at the end of the second spring facing away from the frame structure.

16. MMS according to claim 14, wherein the first spring and the second spring are a first pair of springs, wherein the third spring and the fourth spring are a second pair of springs and wherein the frame structure is configured to generate tensile stress in the second pair of springs at tensile stress acting in the first pair of springs.

17. MMS according to claim 14, wherein the angle is variable by the displacement of the anchor areas.

18. MMS according to claim 14, wherein the first lever element and the second lever element are movable with respect to one another and wherein the third lever element and the fourth lever element are movable with respect to one another.

19. MMS according to claim 14, wherein the first lever element and the second lever element comprise a variable angle with respect to one another during displacement of the first anchor area and the second anchor area along the first and second displacement direction and wherein the third lever element and the fourth lever element comprise a variable angle with respect to one another during displacement of the third anchor area and the fourth anchor area along the third and fourth displacement direction.

20. MMS according to claim 1 comprising a micromirror connected to the movable element.

21. MMS according to claim 14 comprising a micromirror connected to the movable element.

22. MMS array comprising a plurality of MMS according to claim 1.

23. MMS array comprising a plurality of MMS according to claim 14.

24. MMS actuator comprising an MMS according to claim 1 or an MMS array comprising a plurality of MMS according to claim 1.

25. MMS actuator comprising an MMS according to claim 14 or an MMS array comprising a plurality of MMS according to claim 14.

* * * * *